United States Patent [19]
Perissinotto et al.

[11] Patent Number: 5,485,317
[45] Date of Patent: Jan. 16, 1996

[54] OPTICAL SYSTEM FOR LIGHT EMITTING DIODES

[75] Inventors: Claudio Perissinotto, Torreano Di Martignacco; Antonio Fiorentini, Milan, both of Italy

[73] Assignee: Solari Udine S.p.A., Udine, Italy

[21] Appl. No.: 134,295

[22] Filed: Oct. 8, 1993

[30] Foreign Application Priority Data

Jul. 23, 1993 [IT] Italy ................................ MI93A1654

[51] Int. Cl.$^6$ .............................. G02B 3/02; G02B 13/18
[52] U.S. Cl. ........................... 359/712; 359/708; 359/718
[58] Field of Search .................................. 359/708, 712, 359/718

[56] References Cited

U.S. PATENT DOCUMENTS 2,215,900  9/1940  Bitner ....................................... 359/718
2,224,178  12/1940  Bitner ....................................... 359/718
2,254,961  9/1941  Harris ....................................... 359/718
4,770,514  9/1988  Silverglate ............................... 359/708

*Primary Examiner*—Georgia Y. Epps
*Assistant Examiner*—Evelyn A. Lester
*Attorney, Agent, or Firm*—Hedman, Gibson & Costigan

[57] ABSTRACT

The diode is incorporated in a fixed manner on the optical axis of a carrier lens. The carrier lens consists of a front portion with an outer transverse surface, formed concave towards the emitted light, and a longitudinal portion for incorporating he diode. The longitudinal portion has its outer longitudinal surface formed concave towards the diode. The concave transverse surface is surrounded by a further outer transverse system. The concave longitudinal surface is arranged to reflect the diode-emitted light rays towards the further outer transverse surface, which is arranged to transmit the light rays to the outside in a longitudinal direction.

14 Claims, 5 Drawing Sheets

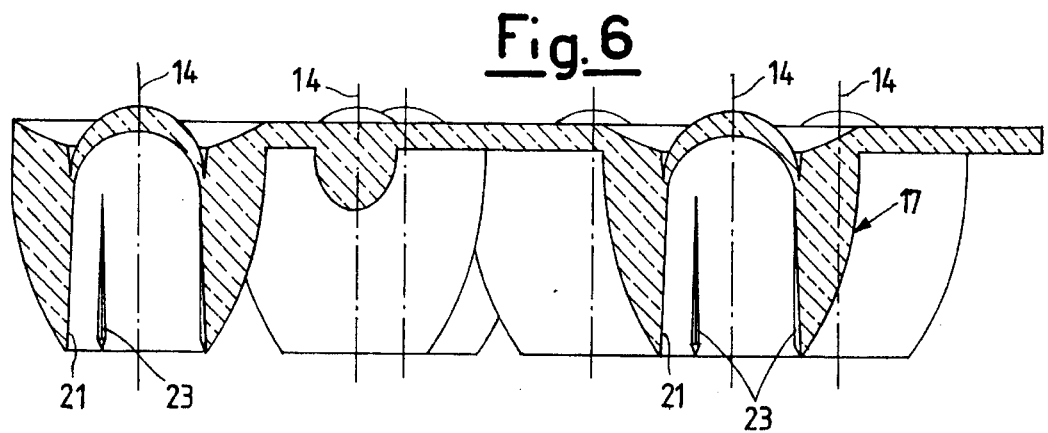
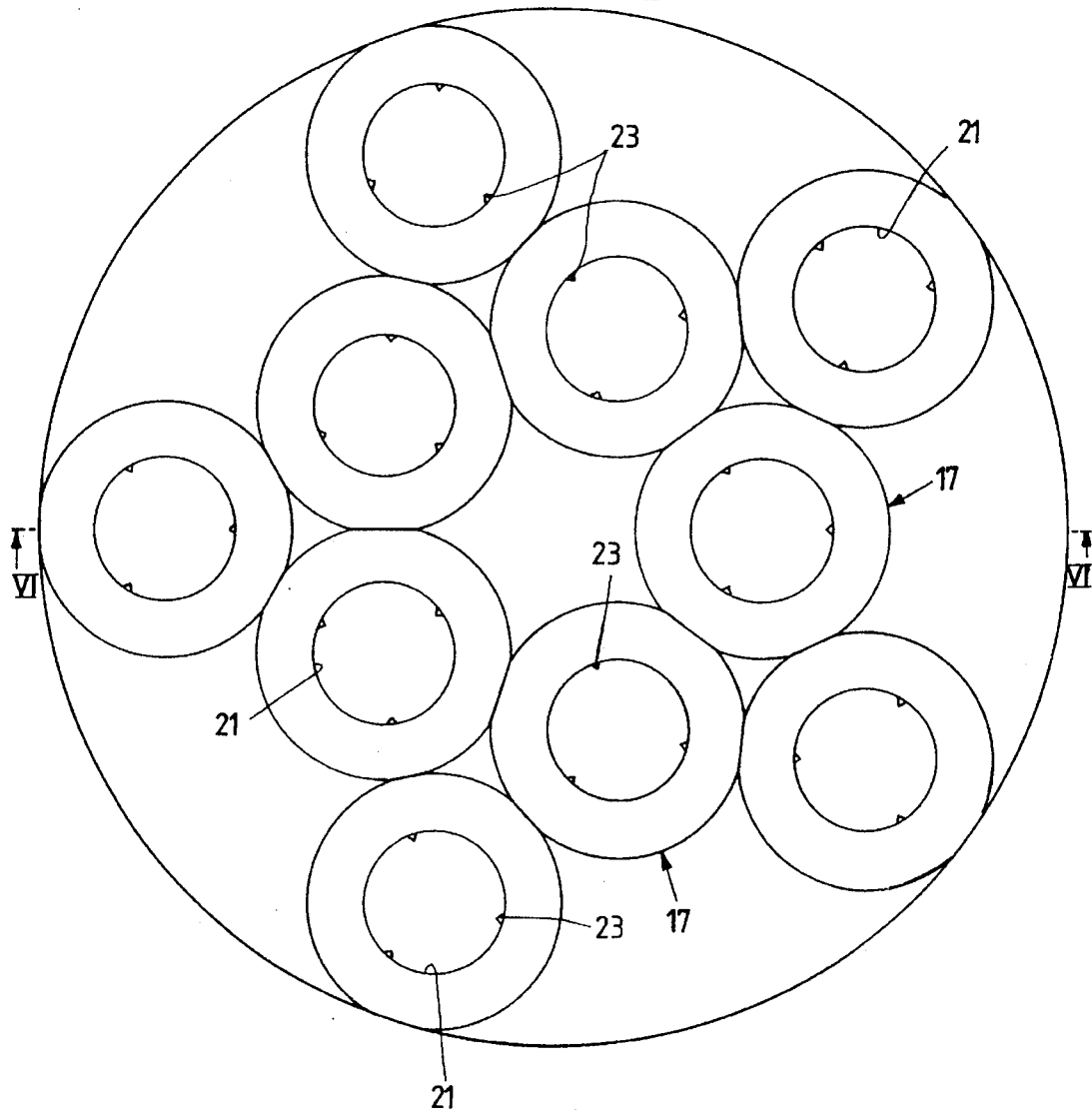

OPTICAL SYSTEM FOR LIGHT EMITTING DIODES

This invention relates to an optical system for light emitting diodes.

An optical system for light emitting diodes (LEDs) is known in which the diode, which acts as a light-emitting semiconductor element, is incorporated in a fixed manner on the optical axis of a carrier lens. The carrier lens consists of a front portion with an outer transverse surface formed concave towards the emitted light, and a longitudinal portion with an outer longitudinal surface, for incorporating the diode.

This optical system has the drawback that the light rays are emitted with considerable dispersion, causing wastage of the emitted light energy and a consequent limitation in the performance of the optical system. This dispersion is also very influenced by the extent of the geometrical tolerances in positioning the LED relative to the carrier lens, which acts as a container and rigidifies the position of the constituent elements of the active part of the LED. These geometrical tolerances are practically inevitable with current LED production methods, because of which the optical systems are produced only in a few limited types without particular adaptation and personalization to the emitting element. Manufacturers are therefore compelled to apply a careful selection procedure to the LEDs produced, with substantial cost increase, in order to market homogeneous batches. The object of the present invention is to provide an optical system which does not present the said drawback and which enables high intensity to be achieved with only modest dispersion. This object is achieved according to the invention by an optical system for light emitting diodes, in which the diode is incorporated in a fixed manner on the optical axis of a carrier lens, said carrier lens consisting of a front portion with an outer transverse surface, formed concave towards the emitted light, and, for incorporating the diode, a longitudinal portion with an outer longitudinal surface, characterised in that said outer longitudinal surface is formed concave towards the diode and said concave transverse surface is surrounded by a further outer transverse system, in which said concave longitudinal surface is arranged to reflect the diode-emitted light rays towards said further outer transverse surface, which is arranged to transmit said light rays to the outside in a longitudinal direction. This optical system of the present invention has the advantage that the performance of the optical system is considerably increased by the reduction in the light radiation dispersion by virtue of the outer longitudinal surface and the further transverse surface of the carrier lens according to the present invention.

The technical characteristics and further advantages of the present invention will be more apparent from the description given hereinafter by way of non-limiting example with reference to the accompanying drawings, in which:

FIG. 5 is a view from below of a group of ten outer lens elements of the optical system of FIG. 2;

FIG. 6 is a longitudinal section through the group of outer lens elements on the line VI—VI of FIG. 5;

FIG. 1 shows an optical system for light emitting diodes (LEDs) in accordance with the present invention.

Figure 1:
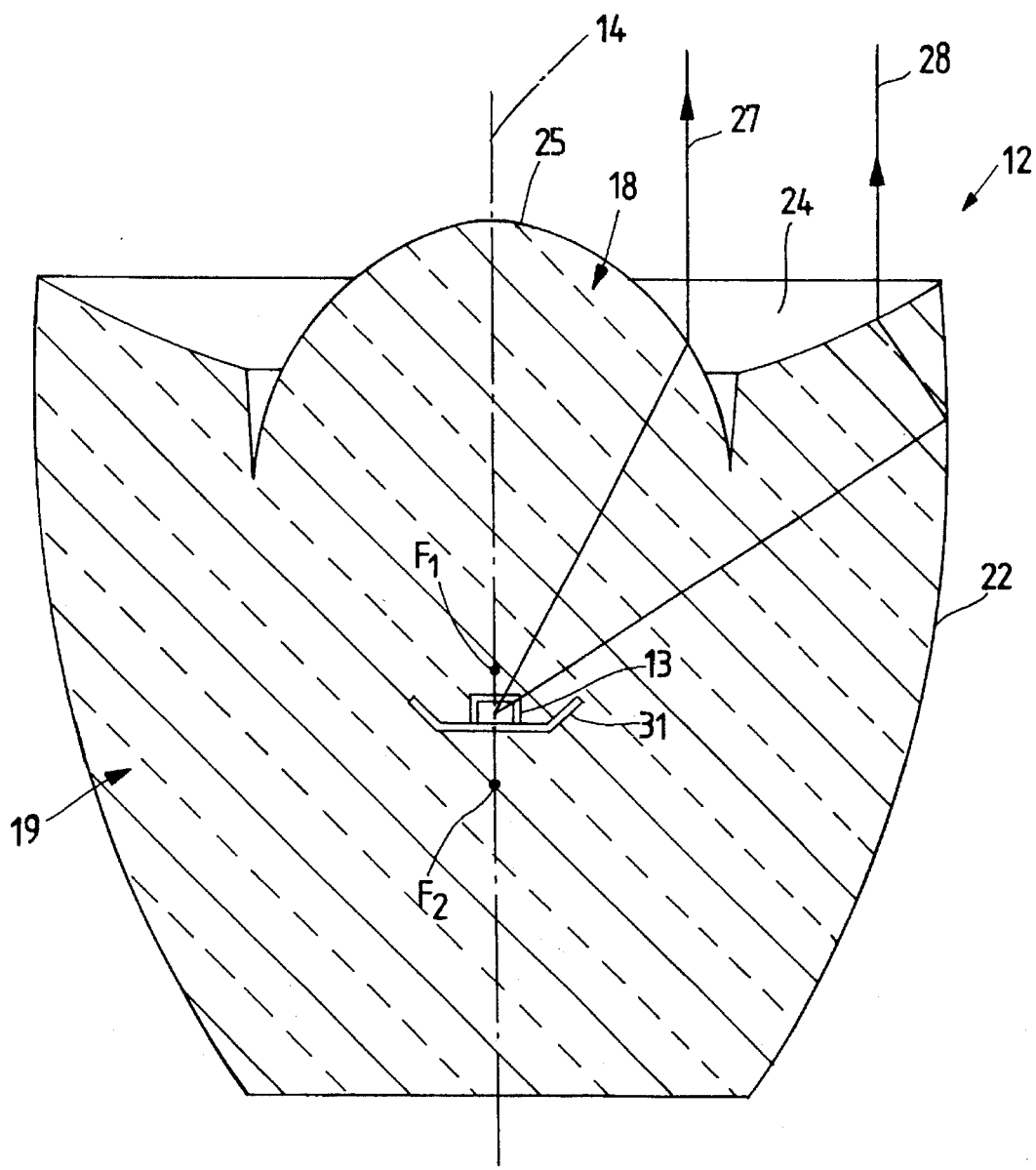
FIG. 1 is a longitudinal section through the optical system of the present invention.

It comprises a carrier lens, indicated overall by 12, with a diode 13 incorporated in a fixed manner on the optical axis 14 within the carrier lens 12. A mirror 31 is positioned within the carrier lens 12 in such a manner that the light emitted by the diode 13 can be transmitted by the optical system only in a frontal direction. The carrier lens 12 consists of a front portion 18 with an outer transverse surface 25 formed concave towards the emitted light, and a longitudinal portion 19 for incorporating the diode 13 with the mirror 31.

The longitudinal portion 19 is shaped such that its outer longitudinal surface 22 is concave towards the diode 13, in this case with its major diameter close to the front portion 18. The transverse surface 25 is surrounded by a further outer transverse surface 24 having a convex shape of spherical or ellipsoidal nature towards the light emitted in a longitudinal direction. It can also be seen from FIG. 1 that in this case the further outer transverse surface 24 surrounds the front portion 18 of the carrier lens 12 coaxially, and the outer longitudinal surface 22 of the carrier lens 12 is coaxial with the optical axis 14. By virtue of its outer configuration, the longitudinal portion 19 is able to reflect light rays emitted by the diode 13 via the concave longitudinal surface 22 towards the further outer transverse surface 24, which is able to transmit the light rays to the outside in a longitudinal direction.

As an example of the operation of the optical system, FIG. 1 shows a light ray 27 emitted by the diode 13 in a direction towards the outer transverse surface 25, at which it is refracted such that it leaves the carrier lens 12 in the longitudinal direction and hence parallel to the optical axis 14. It also shows a light ray 28 striking the outer longitudinal surface 22, at which it is refracted to reach the transverse surface 24, which refracts it in the longitudinal direction parallel to the optical axis 14.

Figure 2:
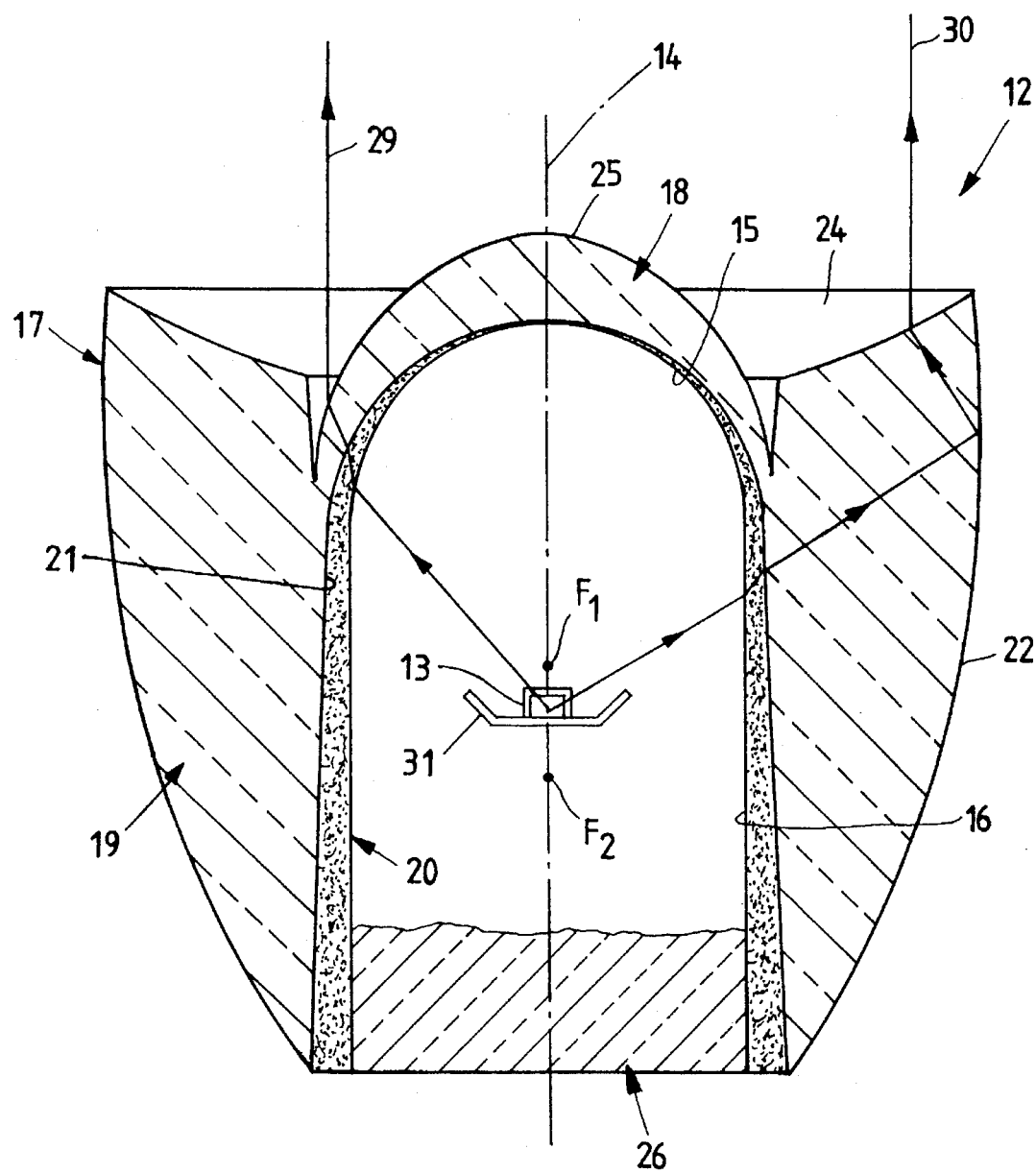
FIG. 2 is a longitudinal section through a second embodiment of the optical system of the present invention.

Hence the diode 13, together with the mirror 31, is able to emit light rays within a solid angle of $2\pi$ about the optical axis these being conveyed by the optical system formed by the surfaces 22, 24 and 25 into a beam of limited angular aperture. FIG. 2 shows a second embodiment of the optical system according to the present invention, in which parts corresponding to the embodiment of FIG. 1 are indicated by the same numerals. In this case the carrier lens 12 consists of a plurality of lenses, namely an outer lens element 17, an inner lens 26 carrying the diode 13 with the mirror 31, and an intermediate lens 20. The outer lens element 17 has the same external configuration as the carrier lens 12 of the first embodiment of FIG. 1 and is provided internally with a cavity 21. The cavity 21 is bounded in a longitudinal direction by a front part 18 and in a direction perpendicular to the optical axis 14 by a longitudinal part 19. The cavity 21 is therefore open in a longitudinal direction in front of the front part 18 to allow the inner lens 26 to be inserted into the outer lens element 17.

The inner lens 26 is integrated into the cavity 21 such that the intermediate lens 20 is positioned between the inner lens 26 and the lens element 17 and formed by in-situ polymerization of a suitable resin. In this manner the intermediate lens 20 fixes the inner lens 26 to the lens element 17 so that there are no gaps in the cavity 21.

The inner lens 26 comprises in its front part a surface 15 concave towards the emitted light and at its longitudinal part a cylindrical or frusto-conical surface 16. In this case the front part of the inner lens 26 is generally of hemispherical shape.

The outer lens element 17 is shaped according to the present invention such that the front part 18 is in the form of the meniscus cup concave towards the emitted light. The longitudinal part 19 is shaped such that the cavity 21 is in the form of a cone frustum with its minor diameter towards the front part 18. As an example of the operation of the second embodiment of the optical system, FIG. 2 also shows a light ray 29 emitted by the diode 13 and refracted at the two separation surfaces of the intermediate lens 20 in the direction of the outer transverse surface 25, at which it is refracted such that it emerges from the carrier lens 12 again in a longitudinal direction parallel to the optical axis 14, It also shows a light ray 30 which strikes the outer longitudinal surface 22, at which it is refracted to reach the transverse surface 24, where it is refracted in a longitudinal direction parallel to the optical axis 14. As can be seen from FIGS. 3 to 6, the lens element 17 is provided in the cavity 21 with a plurality of longitudinal guides 23, in this case three guides 23.

The purpose of the guides 23, which on assembly are in contact with the outer diameter of the inner lens 26, is to position the inner lens 26 plus diode 13 in the cavity 21 such that the diode 13 is always on the optical axis 14.

The carrier lens 12, the outer lens element 17, the intermediate lens 20 and the inner lens 26 are of injection-mouldable transparent polymer. According to the present invention the absolute refractive index of the intermediate lens 20 must be different from the absolute refractive index of the inner lens 26 and of the lens element 17. The absolute refractive index of the inner lens 26 is generally chosen by the manufacturer as high as possible (greater than 1.57) to improve the emissivity of the LED which has an index close to 3. In this case the absolute refractive index of the intermediate lens 20 is between 1.33 and 1.48 and is preferably 1.415, and that of the lens element 17 is between 1.48 and 1.63, and is preferably 1.59.

The complete optical system of the present invention is formed by firstly prefabricating the lens element 17 and the inner lens 26 with the diode 13 and mirror 31 incorporated. The inner lens 26 is then inserted into the cavity 21 of the lens element 17, in which the diode 13 is automatically positioned on the optical axis 14 because of the presence of the longitudinal ides 23. The free space remaining between the inner lens 26 and the lens element 17 is filled by pouring in a transparent thermosetting polymer, which forms the intermediate lens 20. In this manner the optical system 11 becomes a single piece by virtue of the intermediate lens 20.

The improvement in the optical system according to the present invention is based on the fact that the longitudinal surface 22 and the transverse surface 24 of the longitudinal part 19 of the lens element 17 allow recovery of the light radiation which would otherwise be dispersed by the inability of the surface 16, for example cylindrical, of the inner lens 26 to produce adequate transmission.

The optical system of the present invention is therefore a bifocal optical system, being structured such that the longitudinal part 19 (or the longitudinal portion 19 of the embodiment of FIG. 1) has a focal point indicated by F2, which is different from that indicated by F1 of the front part 18 (or of the front portion 18 in the embodiment of FIG. 1). This focal difference is substantially equivalent to the error in the positioning of the diode 13 within the inner lens 26. It is noted that any reduction in the efficiency of the front part 18 (or of the front portion 18 in the embodiment of FIG. 1) caused by the LED positioning error is recovered by the longitudinal part 19 (or by the longitudinal portion 19 in the embodiment of FIG. 1), to increase the efficiency of the optical system, and vice versa. In this manner the achieved overall efficiency of the optical system is practically constant independently of the LED positioning error. The second embodiment of the optical system is therefore applied to existing commercial carrier lenses, which can have any absolute refractive index, and enables their performance to be considerably improved by levelling the varying degree of dispersion in commercial production. In this case the performance is improved on an average by a factor of between 1.5 and 4, depending on whether the initial intensity is high or low.

Figure 4:
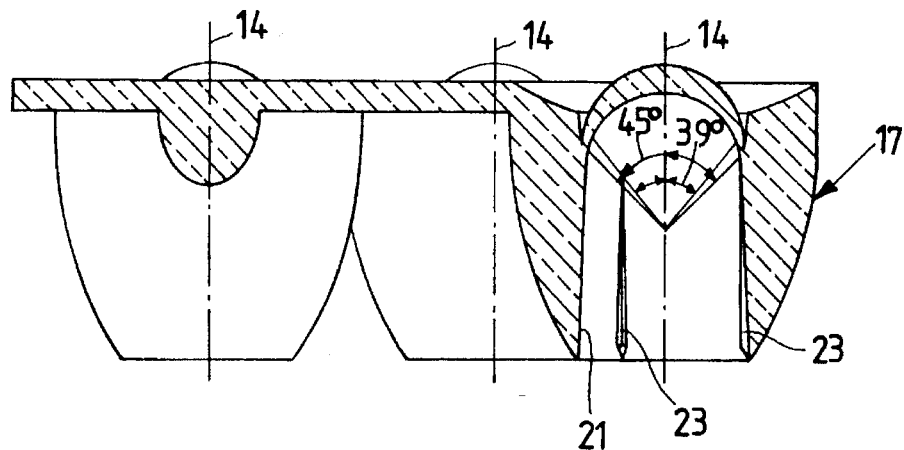
FIG. 4 is a longitudinal section through the group o-outer lens elements on the line IV—IV of FIG. 3.

A commercially existent carrier lens, such as the inner lens 26 with the diode 13 and mirror 31 incorporated, is only effective for transmitting light rays to the outside in the longitudinal direction, these being emitted by the diode 13 in a bundle having an angular aperture of a maximum of 39° about the optical axis 14, as shown in FIG. 4. The application of the optical system of the present invention enables light rays emitted by the diode 13 in a bundle having an angular aperture greater than 39°, for example 45° or more about the optical axis 14, to be transmitted to the outside in a longitudinal direction.

The second embodiment has the further advantage that as the lens element of the present invention is of non-limiting form, the optical system can be easily applied to different types of light emitter device, for example the internal lens type, to always achieve a considerable improvement in the effective performance of the LED.

Figure 3:
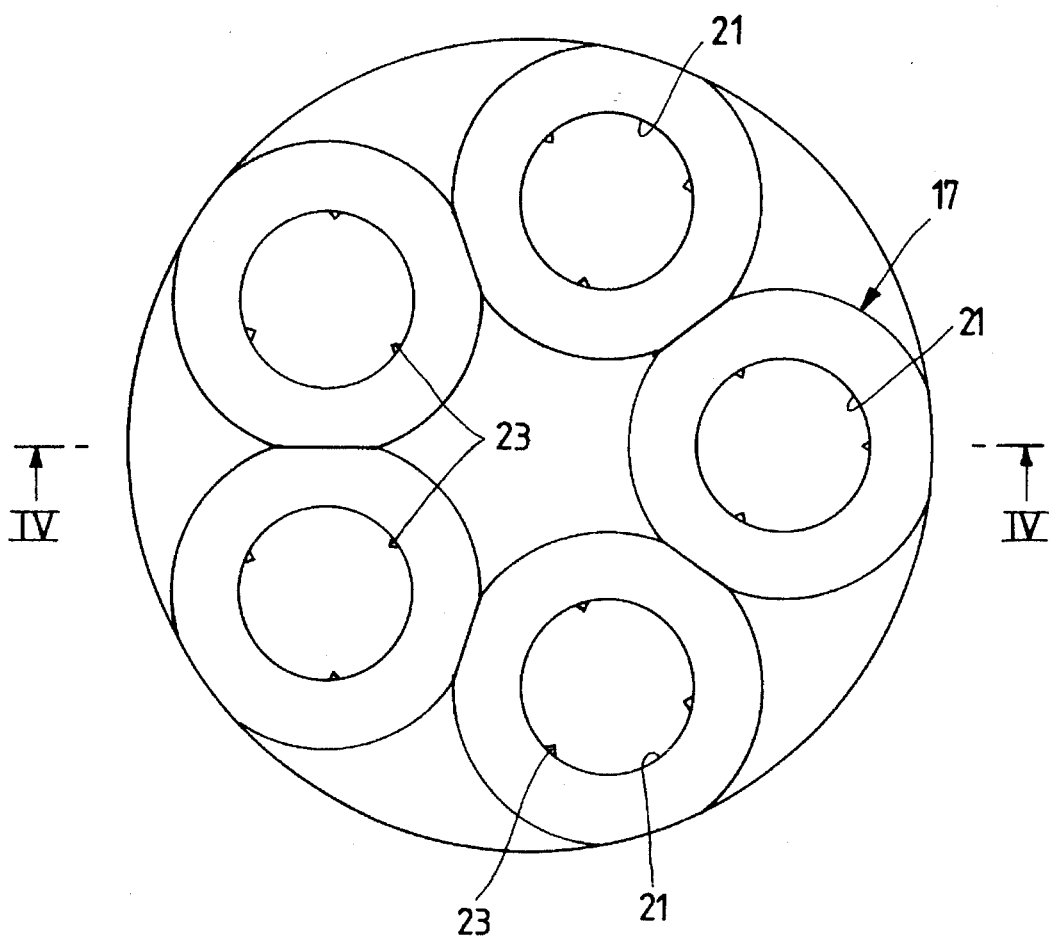
FIG. 3 is a view from below of a group of five outer lens elements of the optical system of FIG. 2.

FIGS. 3 to 6 show groups of lens elements 17, in which each group is formed as a single piece. FIGS. 3 and 4 show a group for example of five lens elements 17, whereas FIGS. 5 and 6 show a group of ten lens elements 17.

Using a plurality of optical systems formed as a single piece, the present invention is very suitable for example for use in variable-message road information panels and in motor vehicle indicators. For this application the present invention is very effective, because if sunlight is present the light emitting diodes 13 must demonstrate maximum performance, which can be achieved only by the present optical system.

Figure 7:
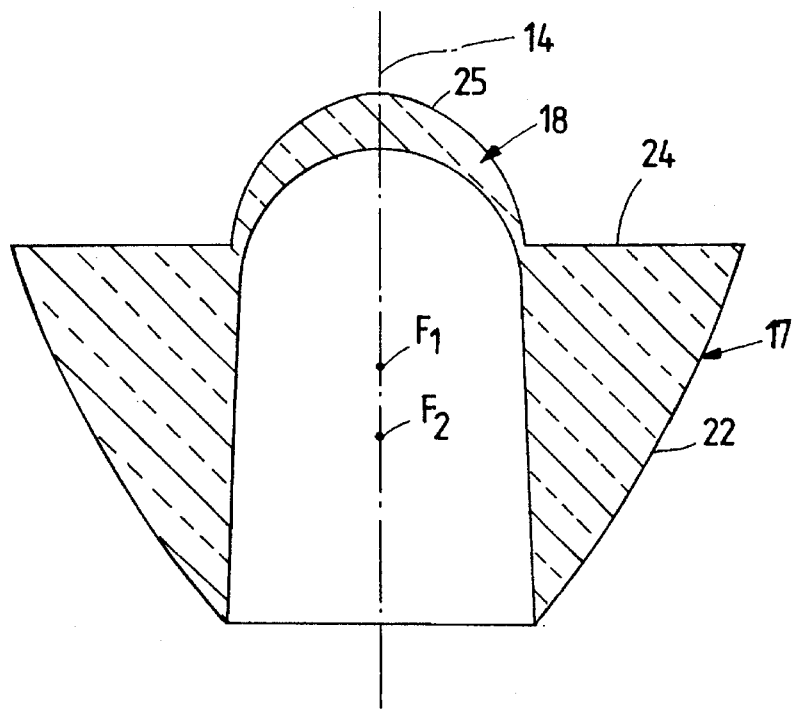
FIG. 7 is a longitudinal section through a second embodiment of the outer lens element of FIG. 2.

FIG. 7 shows a second embodiment of the outer lens element 17 with a flat transverse surface 24 and a paraboloid outer longitudinal surface 22.

Figure 8:
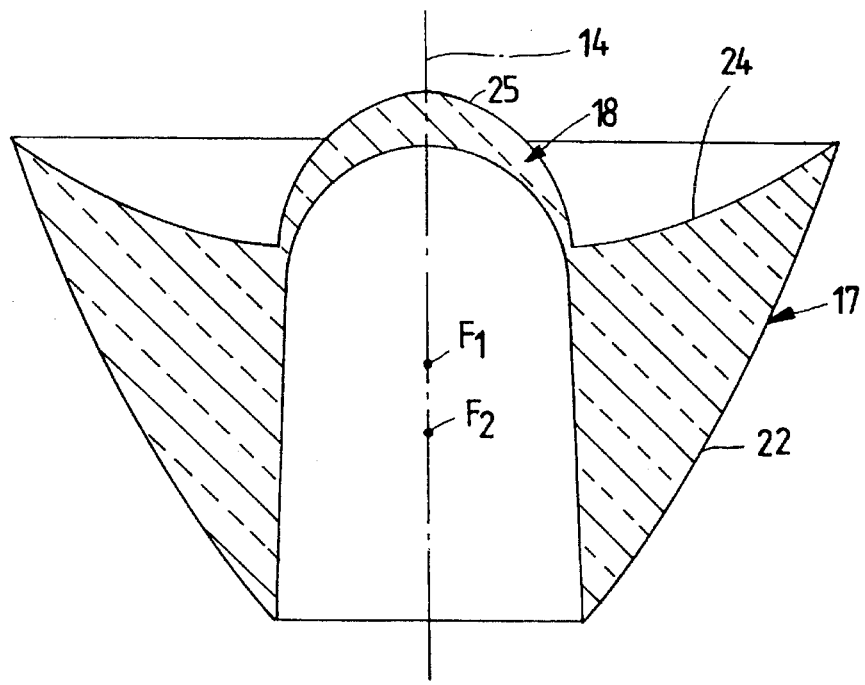
FIG. 8 is a longitudinal section through a third embodiment of the outer lens element of FIG. 2.

In addition, FIG. 8 shows a third embodiment of the outer lens element 17 with a transverse surface 24 of spherical or ellipsoidal rotation shape, the outer longitudinal surface 22 being ellipsoidal.

The second embodiment of the optical system therefore consists of two sub-systems, one being purely dioptric and the other being mixed dioptric-catoptric, in two different practical forms, one of which is homogeneous and to be used for incorporation of the LED 13 in the polymer, and the other being additional employing more than one polymer, to be used to improve the performance of LED devices which are already commercially available. The use of polymers of different refractive index enables even higher performance to be achieved.

In addition the use of a bifocal optical system with its focal points separated by an amount substantially equal to the longitudinal geometrical positioning tolerance of the LED enables the performance to be maintained in proximity to its maximum. To obtain reflection of the light rays from the diode 13 in any direction, the outer longitudinal surface 22 can also be aluminized.

We claim:

1. An optical system for a light emitting diode (13) which is incorporated in a fixed manner on an optical axis (14) of a carrier lens (12), said carrier lens (12) consisting of a front portion (18) with an outer transverse surface (25) formed concave towards emitted light, and for incorporating the diode (13), a longitudinal portion (19) with an outer longitudinal surface (22), wherein said outer longitudinal surface (22) is formed concave towards the diode (13) and is coaxial to the optical axis (14) of the carrier lens and said concave transverse surface (25) having a further outer transverse surface (24) circumscribed thereto characterised in that said outer longitudinal surface (22) has an ellipsoidal form and said further outer transverse surface (24) has a curved form.

2. An optical system as claimed in claim 1, characterised in that said further outer transverse surface (24) which has a curved form is spherical.

3. An optical system as claimed in claim 1, characterised in that said further outer transverse surface (24) which has a curved form is ellipsoidal.

4. An optical system as claimed in claim 1, characterised in that said emitting diode is positioned between the focal point of said outer transverse surface (22).

5. An optical system as claimed in claim 1, characterised in that said carrier lens (12) consists of an outer lens element (17), an inner lens (26) carrying the diode (13) and an intermediate lens (20), in which the said outer lens element (17) has an external configuration corresponding to that of said carrier lens (12) and is provided internally with a cavity (21) bounded in a longitudinal direction by a front part and in a direction perpendicular to the optical axis (14) by a longitudinal part, said inner lens (26) being integrated into said cavity (21) such that said intermediate lens (20) is positioned between the inner lens (26) and the outer lens element (17) and is arranged to fix the inner lens (26) to the outer lens element (17) so that there are no gaps in the cavity (21).

6. An optical system as claimed in claim 5, characterised in that said inner lens (26) comprises at its front part a surface (15) concave towards the emitted light and at its longitudinal part a surface (16) having cylindrical or frusto-conical form.

7. An optical system as claimed in claim 5, characterised in that the outer lens element (17) is shaped so that the front part is in the form of a meniscus cup which is concave towards emitted light, the longitudinal part being shaped such that the cavity (21) is in the form of a frustum of a cone with its minor diameter towards the front part.

8. An optical system as claimed in claim 5, characterised in that the outer lens element (17) is provided in the cavity (21) with a plurality of longitudinal guides (23) arranged to position the inner lens (26) within the cavity (21) so that the diode (13) is always on the optical axis (14).

9. An optical system as claimed in claim 5, characterised in that the carrier lens (12) are made of an injection-mouldable transparent polymer, the intermediate lens (20) being obtained by in-situ polymerization of a thermosetting resin.

10. An optical system as claim in claim 5, characterised in that said intermediate lens (20) has an absolute refractive index is different from the absolute refractive index of the inner lens (26) and of the outer lens element (17).

11. An optical system as claimed in claim 10, characterised in that intermediate lens (20) has an absolute refractive index of between 1.33 and 1.48 the absolute refractive index of the outer lens element (17) being between 1.49 and 1.63.

12. An optical system as claimed in claim 5, characterised in that the outer lens element (17) forms part of a group of outer lens elements (17), which together form a single piece.

13. An optical system as claimed in claim 1, characterised in that said outer longitudinal surface (22) is aluminized.

14. An optical system as claimed in claim 11, characterised in that intermediate lens (20) has an absolute refractive index of 1.415, and an absolute refractive index of the outer lens element (17) of 1.59.

* * * * *